(12) United States Patent
Huang et al.

(10) Patent No.: US 7,108,961 B2
(45) Date of Patent: Sep. 19, 2006

(54) COMPONENT FOR INKJET PRINT HEAD AND MANUFACTURING METHOD THEREOF

(75) Inventors: Chi-Ming Huang, Hsinchu (TW); Chia-Tai Chen, Hsinchu (TW); Yu-Hung Chuang, Hsinchu (TW); Jian-Chiun Lion, Hsinchu (TW); Chien-Hung Liu, Hsinchu (TW); Chun-Jung Chen, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 517 days.

(21) Appl. No.: 10/702,555

(22) Filed: Nov. 7, 2003

(65) Prior Publication Data

US 2005/0045582 A1 Mar. 3, 2005

(30) Foreign Application Priority Data

Aug. 26, 2003 (TW) .............................. 92123441 A

(51) Int. Cl.
*B41J 2/16* (2006.01)
(52) U.S. Cl. ......................................... 430/320; 347/47
(58) Field of Classification Search .................... None
See application file for complete search history.

(56) References Cited

U.S. PATENT DOCUMENTS

| | | | |
|---|---|---|---|
| 5,229,785 A * | 7/1993 | Leban | 347/47 |
| 5,305,015 A | 4/1994 | Schantz et al. | |
| 7,014,987 B1 * | 3/2006 | Takayama et al. | 430/320 |

* cited by examiner

*Primary Examiner*—John A. McPherson
(74) *Attorney, Agent, or Firm*—Brich, Stewart, Kolasch & Birch, LLP

(57) ABSTRACT

A component for the inkjet print head and the manufacturing method thereof are disclosed where photosensitive polymer is used as the substrate. Orifices and ink chambers are made on the substrate by photolithography. Conductive traces for interconnection to a print head chip are integrated to the substrate by combining photolithography and electroforming procedures.

8 Claims, 5 Drawing Sheets

COMPONENT FOR INKJET PRINT HEAD AND MANUFACTURING METHOD THEREOF

This Nonprovisional application claims priority under 35 U.S.C. § 119(a) on patent application Ser. No. 092123441 filed in TAIWAN on Aug. 26, 2003, the entire contents of which are hereby incorporated by reference.

BACKGROUND OF THE INVENTION

1. Field of Invention

The invention relates to a print head component and the manufacturing method thereof. In particular, the invention relates to a component for the inkjet print head that requires a low production costs and the manufacturing method thereof.

2. Related Art

The print head is a key component of inkjet printers. The assembly of current print heads is usually done by first making the orifice plate and the print head chip. Afterwards, a photosensitive adhesive is coated on the chip. Ink chambers and ink supply channels are then formed on the adhesive by photolithography. The orifice plate and the chip are aligned and attached together with the photosensitive adhesive. Finally, tape automated bonding (TAB) leads are aligned and attached onto the electrical signal pads of the chip using high temperature and pressure.

The signal pads of the print head chip are combined with the wire pads of a substrate using aligned embossing of the inner leads. This requires the use of inner lead bonding (ILB) equipment in semiconductor technology. During packaging, the signal pads of the print head chip and the wire pads on the substrate have to be aligned accurately. The wire pads are then connected to the signal pads by embossing. The welded region is filled with glue to increase its reliability. As this procedure requires high precision and has certain difficulty, conditions in the manufacturing process greatly affect the quality of the packaged elements. On the other hand, the orifice plate used in the existing technology is made by electroforming. First, an electroplating solution has to be precisely prepared. A good electroforming quality can be obtained only after long time experiment and calibration. Therefore, it is very hard to control the size, roundness, and thickness of the orifices in such batch produced orifice plates using this method. Moreover, the bonding strength of the metal orifice plate and the inkjet chip may be lowered with time because of the erosion of the ink inside the ink chamber. This will eventually result in local delamination.

One may also form orifices on the TAB by laser ablation. With reference to the U.S. Pat. No. 5,305,015, the manufacturing process starts by forming transmission holes on a TAB substrate. Signal wires are then defined by electroforming or copper foil attaching. Afterwards, a laser beam is shined and focused on the substrate to make an orifice. After a cleaning process, it is combined with the chip by embossing, thus completing the print head chip packaging. However, a laser is used to make orifices individually in this method. There are three hundred nozzles on a high resolution inkjet print head at least. Therefore, it takes a long time and the equipment is expensive. Moreover, the high temperature produced in the process often deforms the borders of the orifices. If one wants to make orifices of different sizes, different lenses have to be used to focus the laser beam. It is also very hard to remove the debris' around the orifices produced in the lasing process.

SUMMARY OF THE INVENTION

In view of the foregoing, the invention provides a component for the print head and the manufacturing method thereof. Ink chambers, orifices, and conductive traces for interconnection to the chip are integrated into a substrate.

The disclosed manufacturing method of the print head component includes the steps of: providing a substrate; forming a sacrifice layer above the substrate; forming a metal conductive circuit above the sacrifice layer; forming a photosensitive polymer layer above the metal conductive circuit; making orifices on the photosensitive polymer layer by photolithography and providing through holes for electrical connection of the metal conductive circuit to the exterior, the orifice allowing fluid to pass and the through holes exposing the lead end of the metal conductive circuit for electrical connection with the exterior; and removing the sacrifice layer so that the photosensitive polymer layer and the metal conductive circuit attached thereon detach from the substrate. Moreover, one can form a second photosensitive polymer layer on the surface of the previous photosensitive polymer and use photolithography to form an ink chamber or channel on the second photosensitive polymer layer. The ink chamber communicate with and connects to each orifice. The channel provides ink to the ink chamber.

The invention further discloses a print head component, which contains: a photosensitive polymer substrate with more than one orifice for a fluid to pass through, the orifices being formed by photolithography; a metal conductive circuit with a front end and a lead end and installed on the surface of the photosensitive polymer substrate, the front end receiving external signals and the lead end providing electrical connection to the chip. The lead end of the metal conductive circuit is thus exposed to the ambient space.

BRIEF DESCRIPTION OF THE DRAWINGS

The invention will become more fully understood from the detailed description given hereinbelow illustration only, and thus are not limitative of the present invention, and wherein.

DETAILED DESCRIPTION OF THE INVENTION

The invention employs a combination of exposure, development, and electroforming methods to make an integrated print head component. Please refer to FIGS. 1 to 7 for a first embodiment of the invention.

Figure 1:
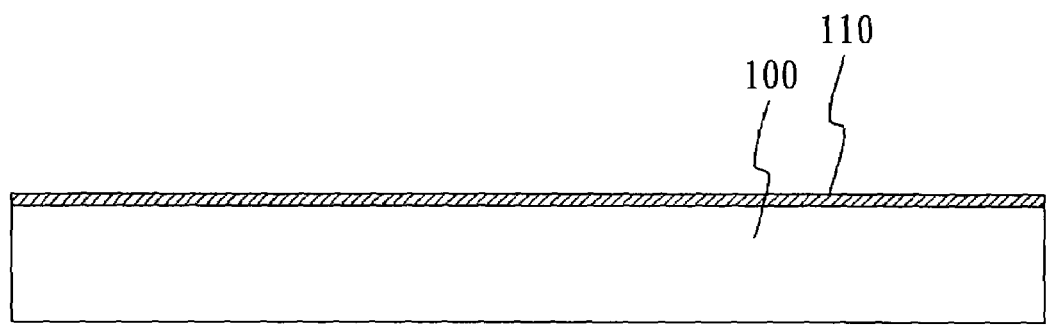
FIGS. 1 through 7 show the flowcharts in the first embodiment of the invention.
Figure 2:
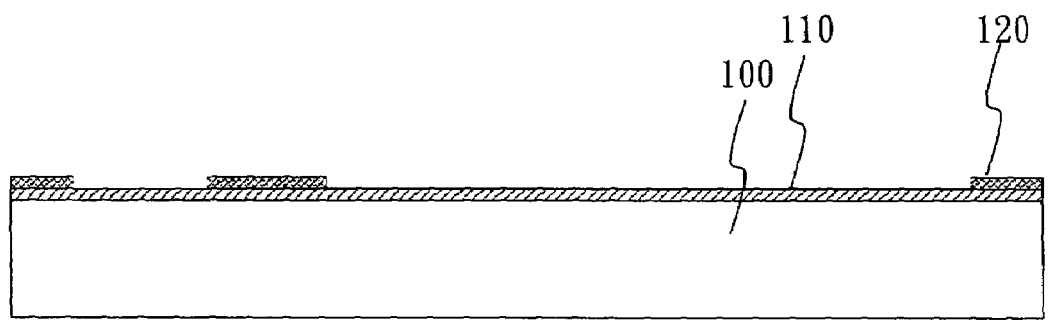
Figure 3:
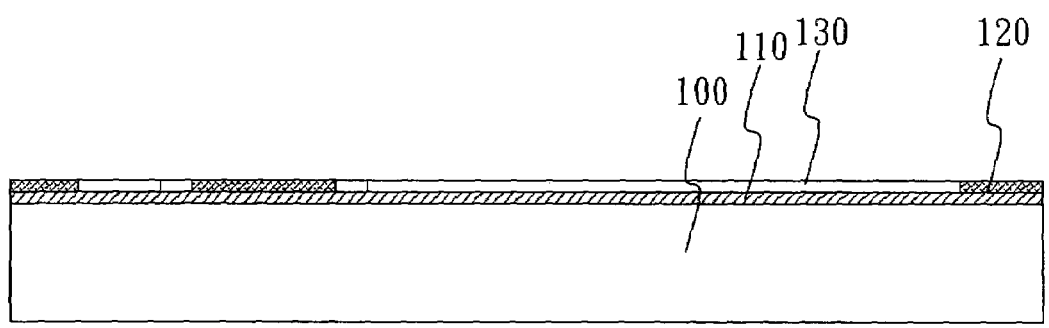

As shown in FIG. 1, we first deposit a metal sacrifice layer 110 on the surface of a substrate 100. As shown in FIG. 2, a photoresist layer 120 is defined on the sacrifice layer 110. As shown in FIG. 3, a metal conductive circuit 130 is formed in the gap of the photoresist 120 by electroforming.

Figure 4:
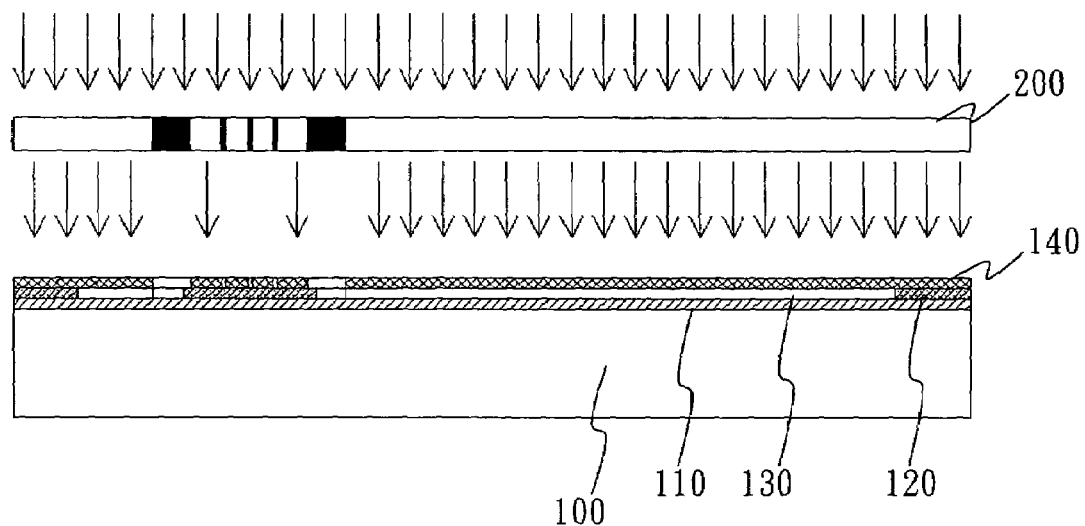

As shown in FIG. 4, a photosensitive polymer layer 140 is coated on the metal conductive circuit 130. A photolithography process is further employed to define orifices and through holes for the lead end of the metal conductive circuit as the electrical connection between the metal conductive circuit 130 and the exterior. The mask 200 has a transparent area and an opaque area. The opaque area blocks the passage of light. The transparent area allows light to pass through, thus shining on part of the photosensitive polymer layer 140 to generate cross-link. An appropriate light source is used to expose the photosensitive polymer layer 140 under the mask 200, defining the orifices and exposing the through holes for the lead end of the metal conductive circuit.

Figure 5:
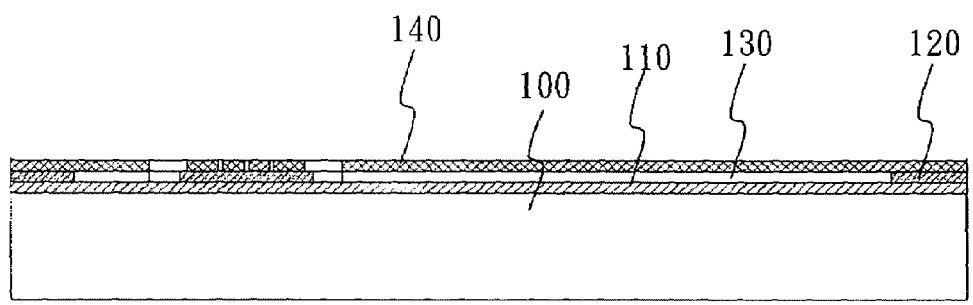

As shown in FIG. 5, the pattern on the exposed photosensitive polymer layer 140 is developed to form the orifices and to expose the through holes for the lead end of the metal conductive circuit.

Figure 6:
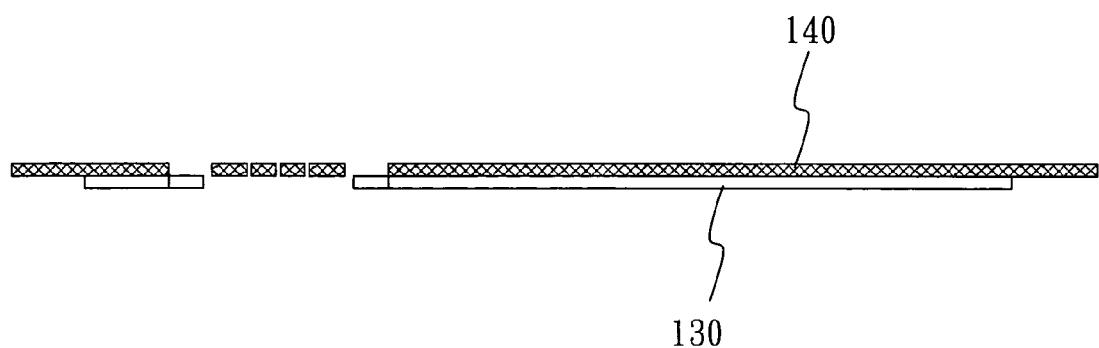

As shown in FIG. 6, the metal sacrifice layer 110 and the photo resist layer for electroforming are removed. Therefore, the metal conductive circuit 130 and the photosensitive polymer layer 140 are separated from the substrate 100 to form a soft circuit board with orifices. This above-mentioned method can quickly make the component to be packaged into an ink jet print head chip. The component includes several orifices and a metal conductive circuit, replacing the original orifice plate and TAB packaging plate.

Figure 7:
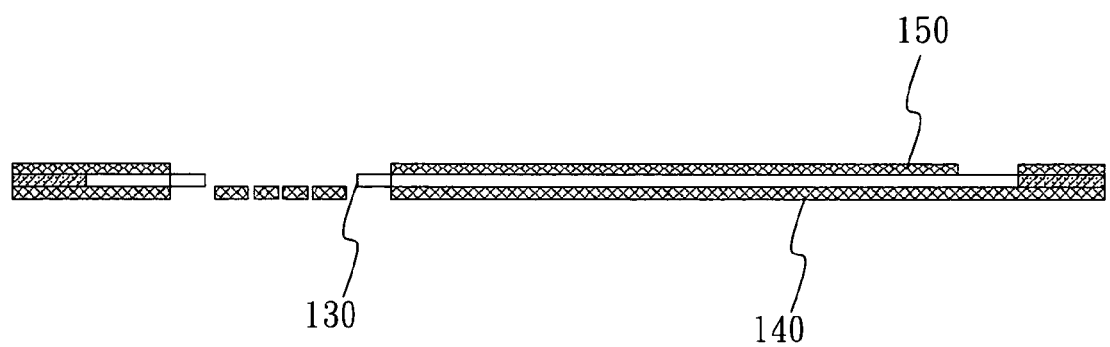

As shown in FIG. 7, before removing the photoresist layer for electroforming the metal, the soft circuit board is turned over to form a passivation layer 150 on the surface of the metal conductive circuit 130 using photolithography. The photoresist layer is then removed at the same time when developing the pattern on the passivation layer 150.

In particular, the metal sacrifice layer in the first embodiment can be substituted by another sacrifice layer made of other materials. When forming the metal conductive circuit using electroforming, a seed metal layer has to be formed on the surface of the sacrifice layer for the convenience of subsequent electroforming processes. Alternatively, one may use the photolithography method to make the metal conductive circuit directly. A metal layer is first deposited on the surface of the sacrifice layer, followed by photoresist coating, exposure, developing, and etching.

Moreover, the invention also disclosed a soft circuit board structure with orifices that integrates an ink chamber and a fluid channel.

Please refer to FIGS. 8 through 11 for a second embodiment of the invention. The steps are the same as FIGS. 1 through 4 in the first embodiment. First, a metal sacrifice layer is deposited on the surface of a substrate. A photoresist layer is then defined on the surface of the sacrifice layer. Afterwards, a metal conductive circuit is formed above the metal sacrifice layer by electroforming. A first photosensitive polymer layer is coated on the metal conductive circuit. After exposing the first photosensitive polymer layer using an appropriate light source and through a mask, orifices and through holes are exposed from the lead end of the metal conductive circuit are defined.

Figure 8:
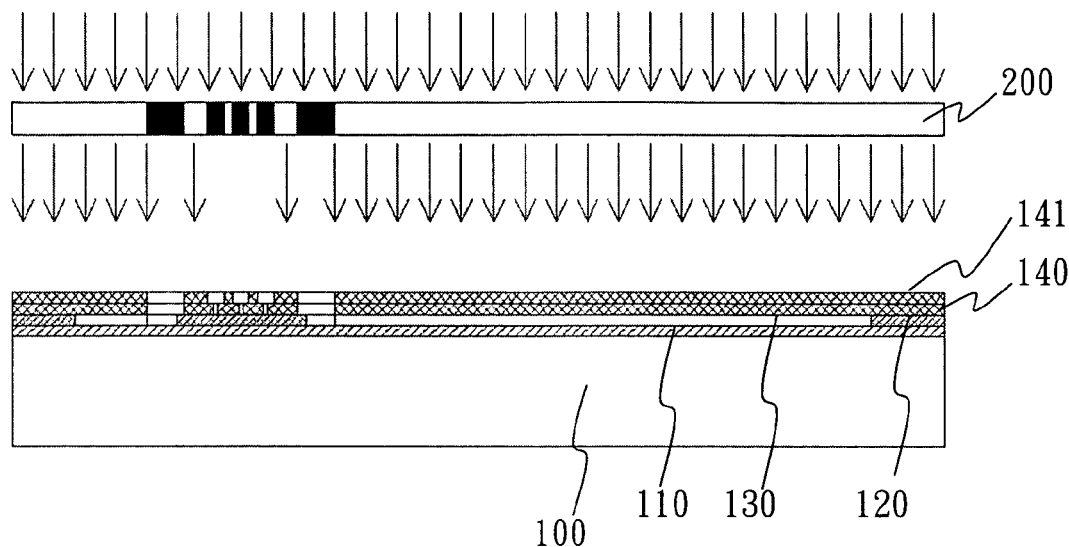
FIGS. 8 through 11 show the flowcharts in the second embodiment of the invention.

As shown in FIG. 8, a second photosensitive polymer layer 141 is formed on the surface 140 of the defined first photosensitive polymer layer 140. An appropriate mask 200 is used to expose the second photosensitive polymer layer 141 to define the ink chamber and channel structures.

Figure 9:
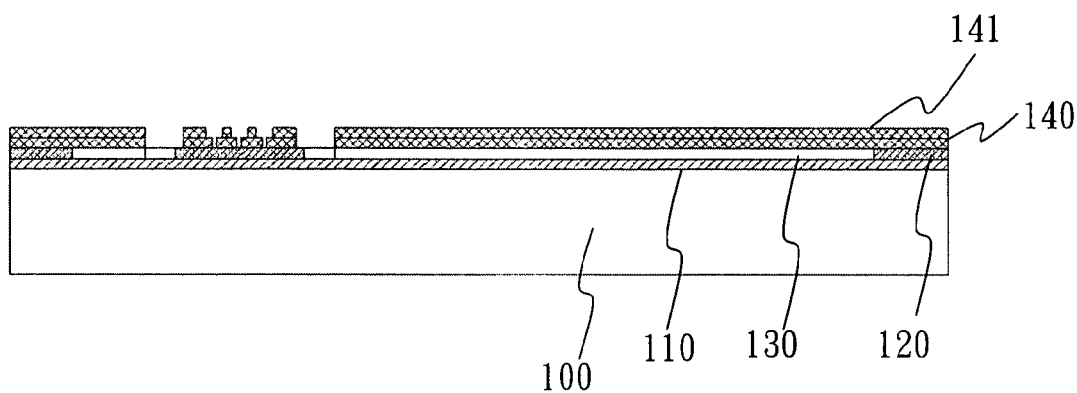

As shown in FIG. 9, the patterns on the second photosensitive polymer layer 141 and the first photosensitive polymer layer 140 are developed to form the structures of the orifices, through holes, ink chamber, and channel.

Figure 10:
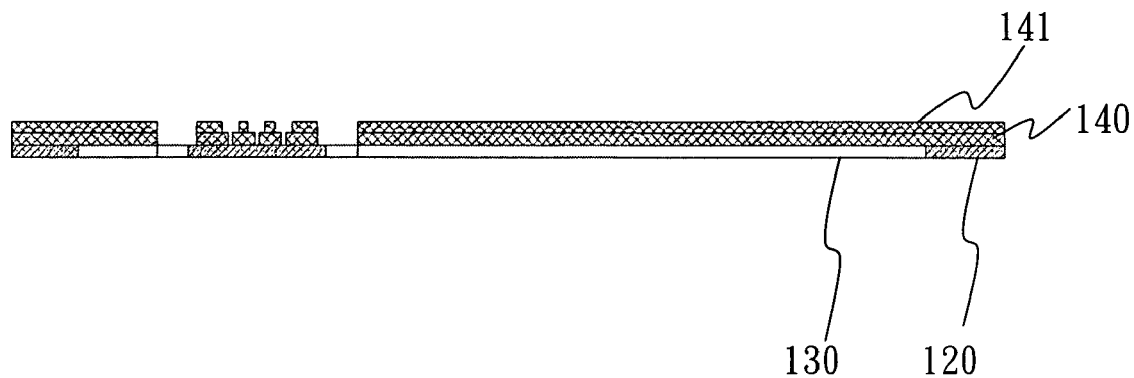

As shown in FIG. 10, the photoresist layer for the metal sacrifice layer 110 and electroforming the metal is removed, so that the metal conductive circuit 130, the first photosensitive polymer layer 140, and the second photosensitive polymer layer 141 are all separated from the substrate 100 to form a soft circuit board with orifices, ink chambers, and channels.

Figure 11:
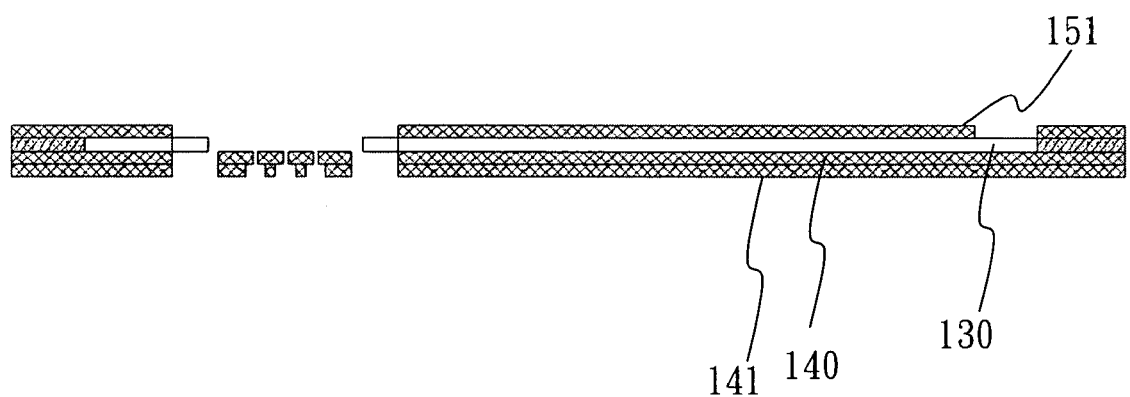

As shown in FIG. 11, one can also turn the soft circuit board over to form a passivation layer 151 on the surface of the metal conductive circuit 130 before removing the photoresist layer. The photoresist is removed when developing the passivation layer 151. The passivation layer 151 is formed on the surface of the metal conductive circuit 130 other than the one attached with the first photosensitive polymer layer 140.

This invention uses the photolithography technology to make orifices. Their roundness and thickness can be arbitrarily controlled. The quality of the component is much better than that of the prior art. One can also use different masks to make irregular orifices. Integrating the orifices and ink chamber together on the soft circuit board to form a single element can effectively reduce the cost. One does not need to make an extract orifice plate and to form the ink chamber on the chip. At the same time, the circuit board substrate, the orifices, and the ink chamber can be rapidly finished on the same platform and using the same method.

Certain variations would be apparent to those skilled in the art, which variations are considered within the spirit and scope of the claimed invention.

What is claimed is:

1. A manufacturing method of a component for an inkjet print head, which comprises the steps of:
   providing a substrate;
   forming a sacrifice layer on a surface of the substrate;
   forming a metal conductive circuit on sacrifice layer;
   forming a first photosensitive polymer layer on the metal conductive circuit;
   forming more than one orifice and more than one through hole on the first photosensitive polymer layer by photolithography, the orifices allowing a fluid to flow through and the through holes being exposed from a lead end of the metal conductive circuit; and
   removing the sacrifice layer so that the photosensitive polymer layer and the metal conductive circuit attached thereon depart from the substrate.

2. The manufacturing method of claim 1, wherein the step of forming a metal conductive circuit on the sacrifice layer uses an electroforming method.

3. The manufacturing method of claim 1, wherein the sacrifice layer is formed from a non-metal material and a step of forming an electroforming seed layer on the sacrifice layer is performed before the step of forming a metal conductive circuit on the sacrifice layer.

4. The manufacturing method of claim 1, wherein the sacrifice layer is made of a metal material.

5. The manufacturing method of claim 1, wherein the step of forming a metal conductive circuit on the sacrifice layer forms a metal layer on the sacrifice layer first and then etches the metal layer to form the desired metal conductive circuit by photolithography.

6. The manufacturing method of claim 1 further comprising the step of forming a fluid structure with a plurality of ink chambers, each of which corresponds to and connects to one of the orifices.

7. The manufacturing method of claim 6, wherein the step of forming a fluid structure with a plurality of ink chambers first forms a second photosensitive polymer layer on the first photosensitive polymer layer and then forms the fluid structure by photolithography.

8. The manufacturing method of claim 1 further comprising the step of forming a passivation layer on the metal conductive circuit, wherein the passivation layer is formed on the surface of the metal conductive circuit other than that attached to the first photosensitive polymer layer.

* * * * *